(12) United States Patent
Yang et al.

(10) Patent No.: US 12,685,205 B2
(45) Date of Patent: Jul. 14, 2026

(54) DELAMINATION/CRACKING IMPROVEMENT AT SOLDER JOINTS IN MICROELECTRONICS PACKAGE

(71) Applicant: Qorvo US, Inc., Greensboro, NC (US)

(72) Inventors: Yinbao Yang, Allen, TX (US);
Xiaokang Huang, Plano, TX (US);
Kenneth Frazee, Orlando, FL (US)

(73) Assignee: Qorvo US, Inc., Greensboro, NC (US)

( * ) Notice: Subject to any disclaimer, the term of this patent is extended or adjusted under 35 U.S.C. 154(b) by 544 days.

(21) Appl. No.: 18/187,386

(22) Filed: Mar. 21, 2023

(65) Prior Publication Data

US 2023/0326899 A1      Oct. 12, 2023

Related U.S. Application Data

(60) Provisional application No. 63/328,439, filed on Apr. 7, 2022.

(51) Int. Cl.
  *H10W 72/30*      (2026.01)
  *H10W 72/00*      (2026.01)
    (Continued)

(52) U.S. Cl.
  CPC ......... *H10W 72/30* (2026.01); *H10W 72/073* (2026.01); *H10W 72/90* (2026.01);
    (Continued)

(58) Field of Classification Search
  CPC ... H01L 2224/0508; H01L 2224/05144; H01L 2224/05147; H01L 2224/05155;
    (Continued)

(56) References Cited

U.S. PATENT DOCUMENTS 6,130,479 A * 10/2000 Chalco .................... H01L 24/11
                                                         257/734
9,230,934 B2 * 1/2016 Lin ......................... H01L 24/16
        (Continued)

FOREIGN PATENT DOCUMENTS

CN      106414884 A  * 2/2017  ......... E06B 3/66357
EP       2023384 A1 * 2/2009  ....... H01L 23/49816
        (Continued)

OTHER PUBLICATIONS

Masson, A. et al., "High temperature die-attaches for SiC power devices," Proceedings of the 2011 14th European Conference on Power Electronics and Applications, Aug. 30-Sep. 1, 2011, Birmingham, UK, IEEE, 11 pages.
        (Continued)

*Primary Examiner* — Telly D Green
(74) *Attorney, Agent, or Firm* — Withrow & Terranova, P.L.L.C.

(57)      ABSTRACT

The present disclosure relates to a microelectronics package with significantly reduced delamination/cracking at solder joints, and a process for making the same. The disclosed microelectronics package includes a carrier, a solder joint region over the carrier, a top intermetallic (IMC) layer over the solder joint region, and a device die over the top IMC layer. Herein, the device die includes a substrate, an active device over the substrate, a top barrier layer underneath the substrate, and a backside metal layer vertically between the top IMC layer and the top barrier layer. The backside metal layer is formed of gold (Au) with a thickness at least 0.5 µm. The top IMC layer comprises gold nickel tin (AuNiSn) or gold platinum tin (AuPtSn), and the solder joint region comprises an Au-rich gold-tin ($Au_5Sn$) and gold-tin (AuSn) eutectic mixture.

14 Claims, 9 Drawing Sheets

(51) Int. Cl.
*H10W 72/90* (2026.01)
*H10W 90/00* (2026.01)

(52) U.S. Cl.
CPC ........................... *H10W 72/07336* (2026.01);
*H10W 72/07355* (2026.01); *H10W 72/352*
(2026.01); *H10W 72/3524* (2026.01); *H10W
72/3528* (2026.01); *H10W 72/923* (2026.01);
*H10W 72/952* (2026.01); *H10W 90/736*
(2026.01)

(58) Field of Classification Search
CPC . H01L 2224/05169; H01L 2224/05172; H01L
2224/05186; H01L 2224/05573; H01L
2224/05644; H01L 2224/29111; H01L
2224/29144; H01L 2224/32245; H01L
2224/32503; H01L 2224/32506; H01L
2224/8381; H01L 2224/83815; H01L
24/05; H01L 24/29; H01L 24/32; H01L
24/83; H01L 2924/01322; H01L
2924/0133; H01L 2924/014; H01L
2924/05; H01L 2924/10253; H01L
2924/10272; H01L 2924/10329; H01L
2924/1033; H10W 72/073; H10W
72/07336; H10W 72/07355; H10W 72/30;
H10W 72/352; H10W 72/3524; H10W
72/3528; H10W 72/90; H10W 72/923;
H10W 72/952; H10W 90/736
See application file for complete search history.

(56) References Cited

U.S. PATENT DOCUMENTS

| | | | | |
|---|---|---|---|---|
| 2007/0114611 | A1* | 5/2007 | Chidambarrao ... | H10D 30/6743 |
| | | | | 257/355 |
| 2011/0031596 | A1* | 2/2011 | Gruenhagen ........... | H01L 24/73 |
| | | | | 257/737 |
| 2011/0220704 | A1* | 9/2011 | Liu ...................... | B23K 35/262 |
| | | | | 428/646 |

| | | | | |
|---|---|---|---|---|
| 2013/0330571 | A1* | 12/2013 | Varma ..................... | H01L 24/03 |
| | | | | 228/172 |
| 2014/0021479 | A1* | 1/2014 | Hyland .................. | H10D 30/63 |
| | | | | 438/653 |
| 2014/0175664 | A1* | 6/2014 | Hagleitner ........ | H01L 21/76898 |
| | | | | 257/774 |
| 2014/0346672 | A1* | 11/2014 | Lin ......................... | H01L 23/48 |
| | | | | 257/737 |
| 2015/0184446 | A1* | 7/2015 | Veerasamy ........... | E06B 3/6612 |
| | | | | 428/34 |
| 2016/0064311 | A1* | 3/2016 | Li ........................... | H01L 24/33 |
| | | | | 257/676 |
| 2017/0095891 | A1* | 4/2017 | Anderson ................. | C22C 9/02 |
| 2020/0075524 | A1* | 3/2020 | Seo ......................... | H01L 24/14 |
| 2020/0313049 | A1* | 10/2020 | Huang ................ | H10H 20/841 |
| 2021/0057370 | A1* | 2/2021 | Komposch ............. | H01L 24/83 |
| 2022/0189895 | A1* | 6/2022 | Morita .................... | H01L 24/20 |
| 2022/0208715 | A1* | 6/2022 | Mueller ................. | H01L 24/05 |
| 2023/0100183 | A1* | 3/2023 | Yamanaka .......... | H01L 25/0753 |
| | | | | 257/79 |
| 2023/0253359 | A1* | 8/2023 | Komposch ............. | H01L 23/66 |
| | | | | 257/77 |

FOREIGN PATENT DOCUMENTS

| | | | | |
|---|---|---|---|---|
| JP | 2014146713 A | * | 8/2014 | |
| WO | WO-2015029810 A1 | * | 3/2015 | ......... H01L 21/4882 |

OTHER PUBLICATIONS

Wu, N. et al., "Microstructure Characterization and Interfacial Reactions between Au—Sn Solder and Different Back Metallization Systems of GaAs MMICs," Materials, vol. 13, No. 6, Mar. 2020, MDPI, 12 pages.
Zhao, H. et al., "Analysis of Microcavity Morphology and Formation Mechanism in AuSn Solder Ring Seal," 2019 20th International Conference on Electronic Packaging Technology (ICEPT), Aug. 12-15, 2019, Hong Kong, China, IEEE, 4 pages.

* cited by examiner

DIE DELAMINATION

DIE DELAMINATION

DELAMINATION/CRACKING IMPROVEMENT AT SOLDER JOINTS IN MICROELECTRONICS PACKAGE

RELATED APPLICATIONS

This application claims the benefit of provisional patent application Ser. No. 63/328,439, filed Apr. 7, 2022, the disclosure of which is hereby incorporated herein by reference in its entirety.

FIELD OF THE DISCLOSURE

The present disclosure relates to an improved microelectronics package with significantly reduced delamination/cracking at solder joints, and a process for forming the improved microelectronics package by soldering a device die on a package carrier, where the device die has a backside metal stack to prevent diffusion of the solder element (Tin), thereby preventing delamination/cracking in the improved microelectronics package.

BACKGROUND

Die delamination or cracking is one of the key reliability concerns for die attachment. For instance, attaching a Gallium Nitride (GaN) die to a copper (Cu) shim with gold/tin (AuSn) solders may cause die delamination in the final package. Typically, the GaN die includes a thick Au layer on the die backside for connecting with the AuSn solders. During the soldering process, when the temperature reaches 280° C., the AuSn solders start to melt. When the temperature increases, the backside Au layer starts to be absorbed into the AuSn solders, and the AuSn solders become more Au rich. When the temperature is kept at 320°, dynamic Au dissolving and re-precipitation continuously occur. Until the temperature decreases back to a eutectic point of 280° C., the interfacial reactions stop. In the meantime, Sn in the AuSn solder diffuses through the backside Au layer, reaches a barrier for the GaN die, typically a nickel (Ni) related barrier, and forms a gold nickel tin (AuNiSn) intermetallic (IMC) region. This AuNiSn IMC region formed with the dynamic Au dissolving/re-precipitation and SN diffusion is very brittle. Because of a large coefficient of thermal expansion (CTE) mismatch between the AuSn solders, the GaN die, and the copper carrier, the brittle AuNiSn IMC region between the GaN die and the AuSn solders will experience extremely high stress during a temperature cycling, and therefore can be easily broken.

FIG. 1 provides an example of a confocal scanning acoustic microscopy (CSAM) image showing die delamination initiated from GaN die corners at solder joints. FIG. 2 provides a focused ion beam (FIB) cross-section image showing cracks at a solder joint in the GaN package.

Accordingly, there remains a need for improved die attaching approaches to form a microelectronics package with significantly reduced delamination/cracking. Further, there is also a need to keep the die attaching approaches cost effective and compatible with typically packaging processes.

SUMMARY

The present disclosure relates to a microelectronics package with significantly reduced delamination/cracking at solder joints, and a process for making the same. The disclosed microelectronics package includes a carrier, a solder joint region formed over the carrier, a top intermetallic (IMC) layer formed over the solder joint region, and a device die formed over the top IMC layer. Herein, the device die includes a substrate, an active device formed over the substrate, a top barrier layer formed underneath the substrate, and a backside metal layer formed vertically between the top IMC layer and the top barrier layer. The backside metal layer has a thickness of at least 0.5 μm.

In one embodiment of the disclosed microelectronics package, the backside metal layer has a thickness between 0.5 μm and 10 μm.

In one embodiment of the disclosed microelectronics package, the backside metal layer is formed of gold (Au), the top IMC layer includes gold nickel tin (AuNiSn) or gold platinum tin (AuPtSn), and the solder joint region includes an Au-rich gold-tin ($Au_5Sn$) and gold-tin (AuSn) eutectic mixture.

In one embodiment of the disclosed microelectronics package, the backside metal layer is formed of copper (Cu), the top IMC layer includes copper nickel tin (CuNiSn) and AuNiSn or includes copper platinum tin (CuPtSn) and AuPtSn, and the solder joint region includes an $Au_5Sn$ and AuSn eutectic mixture.

In one embodiment of the disclosed microelectronics package, the top barrier layer is formed underneath the substrate via an adhesion layer.

In one embodiment of the disclosed microelectronics package, the top barrier layer is formed directly underneath the substrate.

In one embodiment of the disclosed microelectronics package, the active device is one of a Gallium Nitride (GaN) device, a silicon (Si) device, and a Gallium Arsenide (GaAs) device. In addition, the substrate is formed of one of silicon carbon (SiC), Si, GaN, Sapphire, and GaAs.

According to one embodiment, the disclosed microelectronics package further includes a bottom IMC layer vertically between the carrier and the solder joint region. Herein, the carrier includes a base plate and a bottom barrier over the base plate. The bottom IMC layer is formed over the bottom barrier of the carrier.

In one embodiment of the disclosed microelectronics package, the backside metal layer is formed of Au, the top IMC layer includes AuNiSn or AuPtSn, the solder joint region includes an $Au_5Sn$ and AuSn eutectic mixture, the bottom IMC layer includes AuNiSn, the bottom barrier is formed of nickel (Ni), and the base plate comprises Cu.

In one embodiment of the disclosed microelectronics package, the backside metal layer is formed of Cu, the top IMC layer includes AuNiSn and CuNiSn or includes AuPtSn and CuPtSn, the solder joint region comprises an $Au_5Sn$ and AuSn eutectic mixture, the bottom IMC layer includes AuNiSn, the bottom barrier is formed of Ni, and the base plate comprises Cu.

According to an exemplary method of forming a microelectronics package, an initial package precursor, which includes an initial carrier, an initial solder over the initial carrier, and a solderable device die with a cap structure and an initial backside metal layer, is firstly provided. Herein, the cap structure includes at least one anti-oxidation layer formed over the initial solder and includes at least one diffusion blocking layer formed over the at least one anti-oxidation layer. The initial backside metal layer is formed over the at least one diffusion blocking layer. The initial solder includes gold (Au) and tin (Sn), and the initial backside metal layer is formed of Au or copper (Cu). Next, a reflowing process to convert the initial package precursor to a reflowed package precursor is provided. During the reflowing process, the initial solder melts into a molten solder, which provides upward Sn diffusion toward the solderable device die. The at least one diffusion blocking layer in the cap structure of the solderable device is configured to trap the upward Sn diffusion from the molten solder. The at least one diffusion blocking layer, at least portions of the at least one anti-oxidation layer, the upward Sn diffusion from the molten solder, and Au or Cu diffusion from the initial backside metal layer interact to form a top IMC layer. The cap structure is fully dissolved, and the Au diffusion from the initial backside metal layer results in a transition from the initial backside metal layer to a backside metal layer, which has a thinner thickness than the initial backside metal layer. The top IMC layer is above the molten solder and underneath the backside metal layer.

According to one embodiment, the exemplary method further includes cooling the reflowed package precursor to provide the microelectronics package. During the cooling step, the molten solder solidifies to form a solid solder joint region that includes an $Au_5Sn$ and AuSn eutectic mixture.

In one embodiment of the exemplary method, providing the initial package precursor includes forming the solderable device die. The solderable device die includes a substrate, an active device over the substrate, a top barrier layer underneath the substrate, the initial backside metal layer underneath the top barrier layer, and the cap structure underneath the initial backside metal layer.

In one embodiment of the exemplary method, the at least one anti-oxidation layer includes a number of anti-oxidation layers, and the at least one diffusion blocking layer includes a number of diffusion blocking layers. The anti-oxidation layers and the diffusion blocking layers are formed alternately.

In one embodiment of the exemplary method, a total thickness of the plurality of diffusion blocking layers is larger than 1000 Å. None of the diffusion blocking layers is at a bottom surface of the solderable device die.

In one embodiment of the exemplary method, the initial backside metal layer is formed of Au with a thickness of at least 0.5 μm. The at least one anti-oxidation layer is formed of Au, the at least one diffusion blocking layer is formed of one of Nickel Vanadium (NiV), Nickel (Ni), Nickel Nitride (Ni3N2), and platinum (Pt), and the top IMC layer includes AuNiSn or AuPtSn.

In one embodiment of the exemplary method, the initial backside metal layer is formed of Cu, the at least one anti-oxidation layer is formed of Au, the at least one diffusion blocking layer is formed of NiV, Ni, $Ni_3N_2$, and Pt, and the top IMC layer includes AuNiSn and CuNiSn, or includes AuPtSn and CuPtSn.

In one embodiment of the exemplary method, the initial carrier includes a base plate, an initial bottom barrier over the base plate, and a dissolve layer over the initial bottom barrier, such that the initial solder is formed over the dissolve layer. The dissolve layer is formed of Au, the initial bottom barrier is formed of Ni, and the base plate is formed of Cu.

In one embodiment of the exemplary method, during the reflowing process to convert the initial package precursor to the reflowed package precursor, the molten solder further provides downward Sn diffusion toward the initial carrier. Herein, the at least portions of the dissolve layer, portions of the initial bottom barrier, and the downward Sn diffusion from the molten solder interact to form a bottom IMC layer. The bottom IMC layer formation results in a transition from the initial bottom barrier to a bottom barrier, which has a thinner thickness than the initial bottom barrier. The bottom IMC layer is underneath the molten solder and above the bottom barrier.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1:
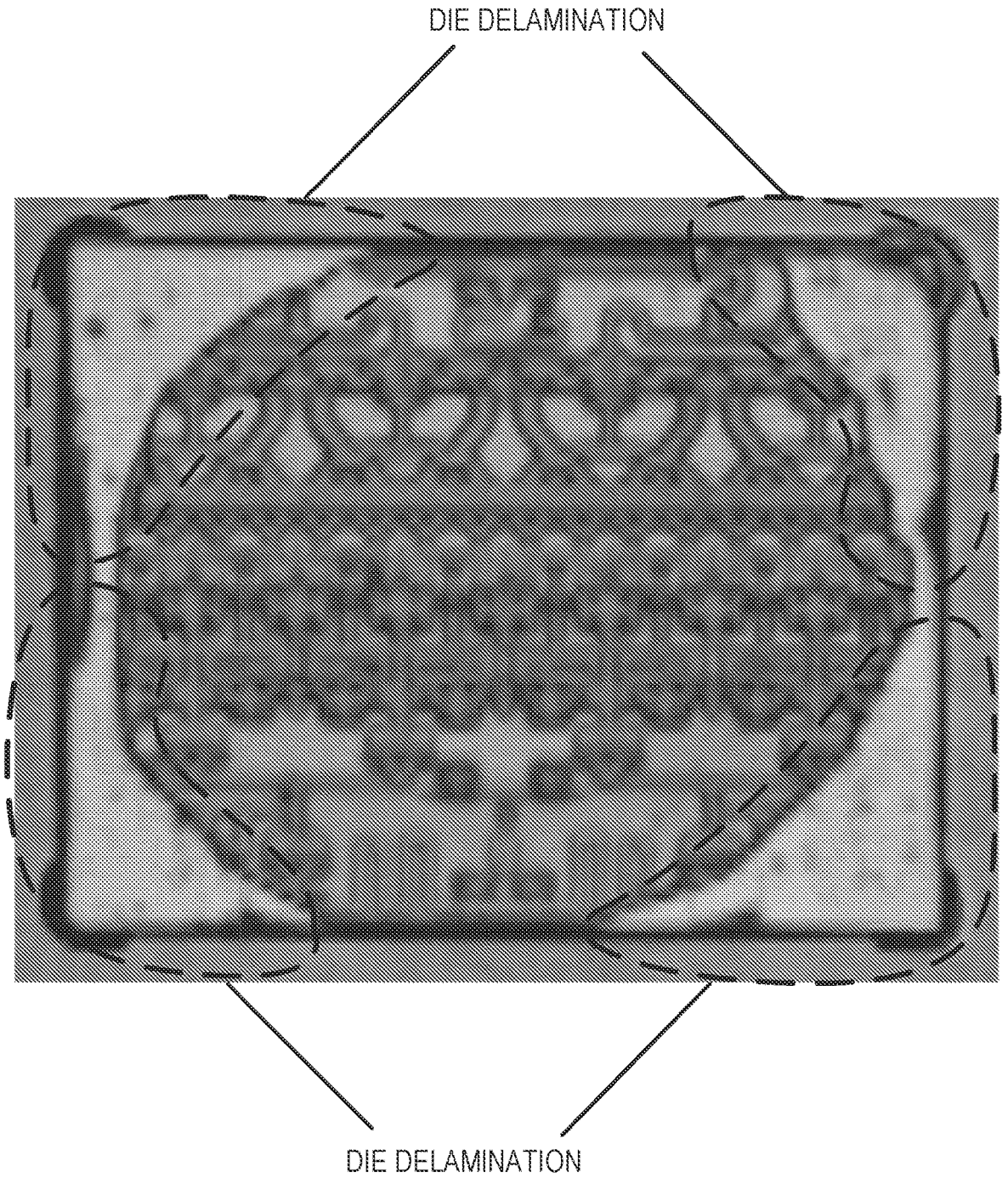
FIG. 1 shows a confocal scanning acoustic microscopy (CSAM) image showing die delamination initiated from Gallium Nitride (GaN) die corners at solder joints.
Figure 2:
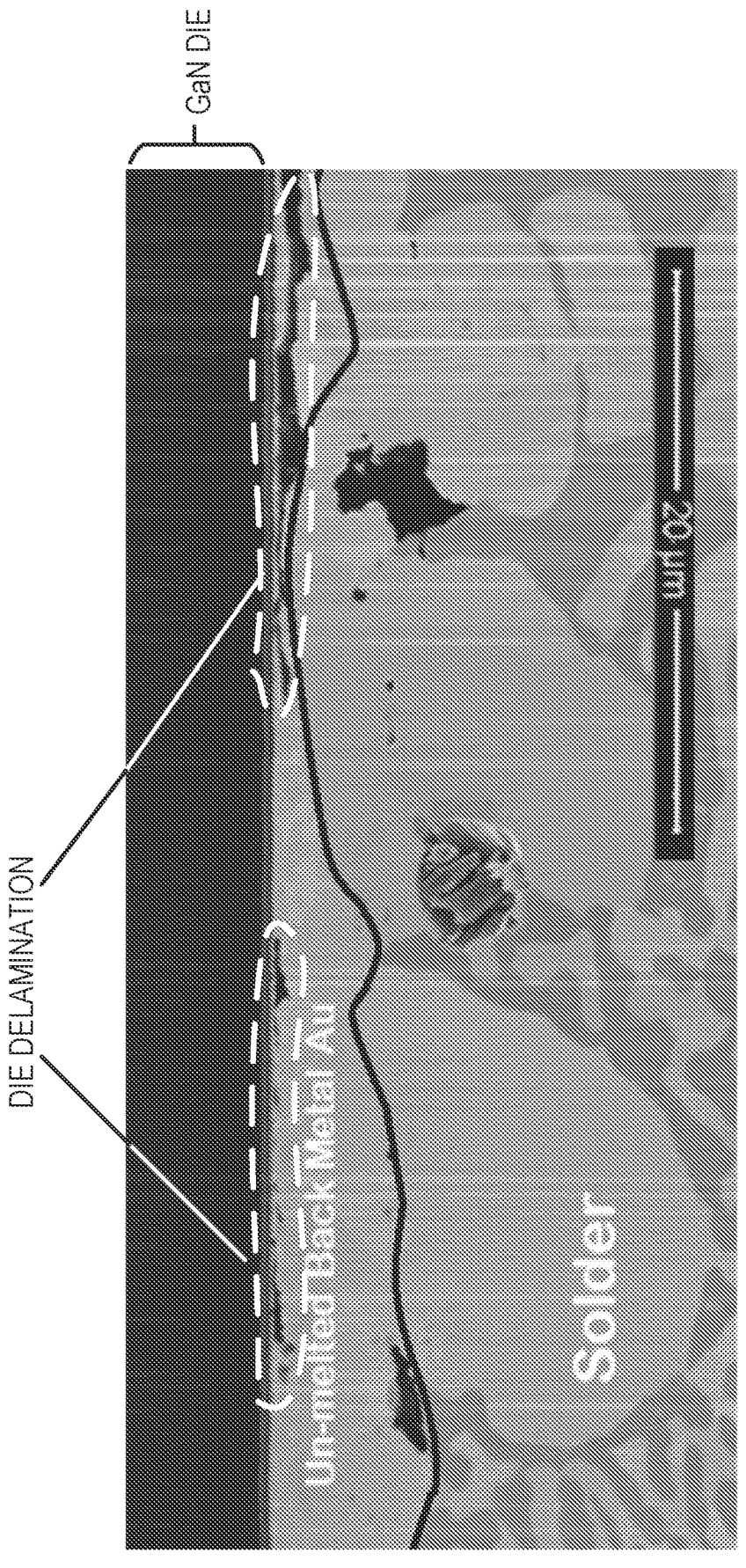
FIG. 2 shows a focused ion beam (FIB) cross-section image showing cracks at a solder joint in a GaN package.

It will be understood that for clear illustrations, FIGS. 1-8 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

Figure 3:
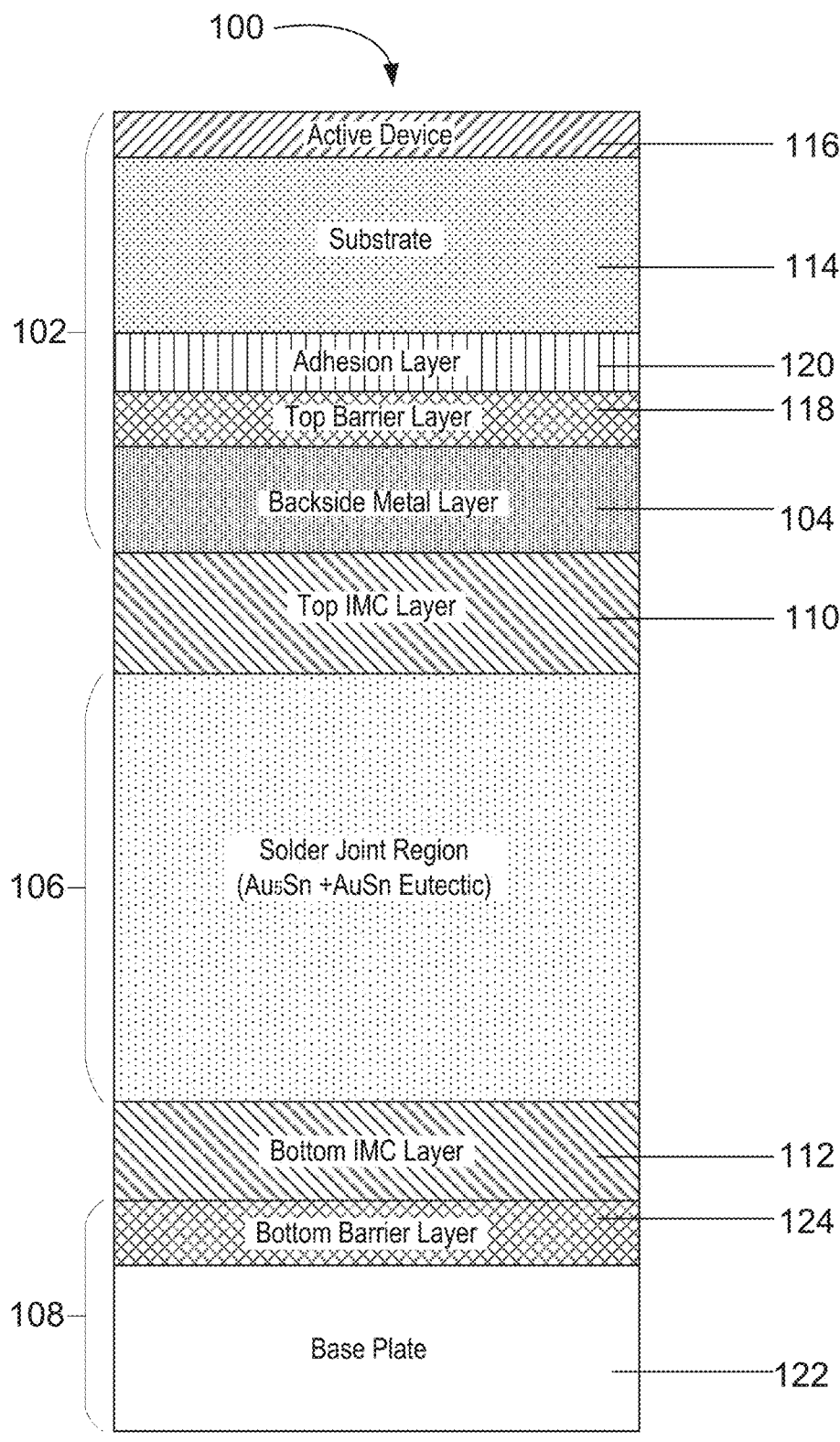
FIG. 3 shows a partial diagram of an exemplary microelectronics package without delamination/cracking according to some embodiments of the present disclosure.

FIG. 3 shows a partial diagram of an exemplary microelectronics package 100 without delamination/cracking according to some embodiments of the present disclosure. For simplicity and clarity, the microelectronics package 100 shown in FIG. 3 only graphically discloses layer configurations at one solder joint. In this illustration, the microelectronics package 100 includes a device die 102 with a backside metal layer 104, a solder joint region 106 underneath the device die 102, a carrier 108 underneath the solder joint region 106, a top intermetallic (IMC) layer 110 vertically between the backside metal layer 104 of the device die 102 and the solder joint region 106, and a bottom IMC layer 112 vertically between the solder joint region 106 and the carrier 108. In realistic applications, the device die 102, the solder joint region 106, the carrier 108, the top IMC layer 110, and the bottom IMC layer 112 may have different sizes and shapes in the horizontal plane. In addition, between the device die 102 and the carrier 108, there might be multiple solder joint regions with multiple corresponding top/bottom IMC layers. In detail, besides the backside metal layer 104, the device die 102 further includes a substrate 114, an active device 116 formed over the substrate 114, and a top barrier layer 118 formed underneath the substrate 114 via an adhesion layer 120. Herein, the active device 116 may be a Gallium Nitride (GaN) device, a silicon (Si) device, a Gallium Arsenide (GaAs) device, or the like, while the substrate 114 may be formed of silicon carbon (SiC), Si, GaN, Sapphire, GaAs, or the like. The top barrier layer 118 is configured to prevent adhesion failure due to diffusion from the backside metal layer 104, while the adhesion layer 120 is configured to help the top barrier layer 118 adhere to the substrate 114. In some applications, the adhesion layer 120 may be omitted when the top barrier layer 118 can self-adhere to the substrate 114. The backside metal layer 104 is formed underneath the top barrier layer 118 and may be formed of gold (Au), copper (Cu), or other conducting metals. A thickness of the backside metal layer 104 is dependent on die size and die applications. Typically, the larger the die 102, the thicker the backside metal layer 104 is desired. Furthermore, based on different materials used for the substrate 114, the thickness of the backside metal layer 104 may vary. In one embodiment, the backside metal layer 104 formed of Au may have a thickness of at least 0.5 μm (e.g., between 0.5 μm and 10 μm, between 0.5 μm and 3 μm, between 3 μm and 10 μm, or even thicker).

The solder joint region 106 may include an Au-rich gold-tin ($Au_5Sn$) and gold-tin (AuSn) eutectic mixture, which may be formed from an AuSn solder (described in the following paragraphs and not shown herein). The overall Au/Sn composition ratio in the solder joint region 106 may be 80/20, 78/22, or etc. . . . . The top IMC layer 110 vertically between the solder joint region 106 and the backside metal layer 104 of the device die 102 may comprise gold nickel tin (AuNiSn) or gold platinum tin (AuPtSn), and is formed during a soldering reflow process (described in the following paragraphs and not shown herein). When the backside metal layer 104 is formed of Cu, the top IMC layer 110 may further include copper nickel tin (CuNiSn) or copper platinum tin (CuPtSn).

The carrier 108 includes a base plate 122 and a bottom barrier layer 124 over the base plate 122. The base plate 122 may be formed of Cu or other metal material(s), and the bottom barrier layer 124 may be formed of Ni. The bottom IMC layer 112 vertically between the solder joint region 106 and the bottom barrier layer 124 of the carrier 108 may comprise AuNiSn and is formed during the soldering reflow process (described in the following paragraphs and not shown herein).

Notice that although there may be a large coefficient of thermal expansion (CTE) mismatch between the substrate 114 and the top IMC layer 110, the top IMC layer 110 will not suffer high stress during temperature cycles (e.g., from −55° C. to 125° C.). It is because the top IMC layer 110 is not close to the substrate 114, but is separated from the substrate 114 by the relatively thick backside metal layer 104. Therefore, even if the top IMC layer 110 is relatively brittle, the top IMC layer 110 is not broken to cause delamination/cracking in the microelectronics package 100. Herein, the backside metal layer 104, between the substrate and the top IMC layer 110, may experience thermal stress during the temperature cycles. However, due to its robust nature, the backside metal layer 104 will not be broken or delaminated. On the other hand, since there is no large CTE mismatch between the carrier 108 and the bottom IMC layer 112, the bottom IMC layer 112 will not suffer high stress and will not be broken or delaminated during the temperature cycles.

FIGS. 4A-4E graphically illustrate an exemplary process for implementing a solderable device die, which is used to form the exemplary microelectronics package 100 shown in FIG. 3, according to some embodiments of the present disclosure. Although the process steps are illustrated in a series, the process steps are not necessarily order dependent. Some steps may be done in a different order than that presented, without deviating from the scope of the present disclosure. Further, processes within the scope of this disclosure may include fewer or more steps than those illustrated in FIGS. 4A-4E.

Figures 4A, 4B, 4C, 4D, 4E:
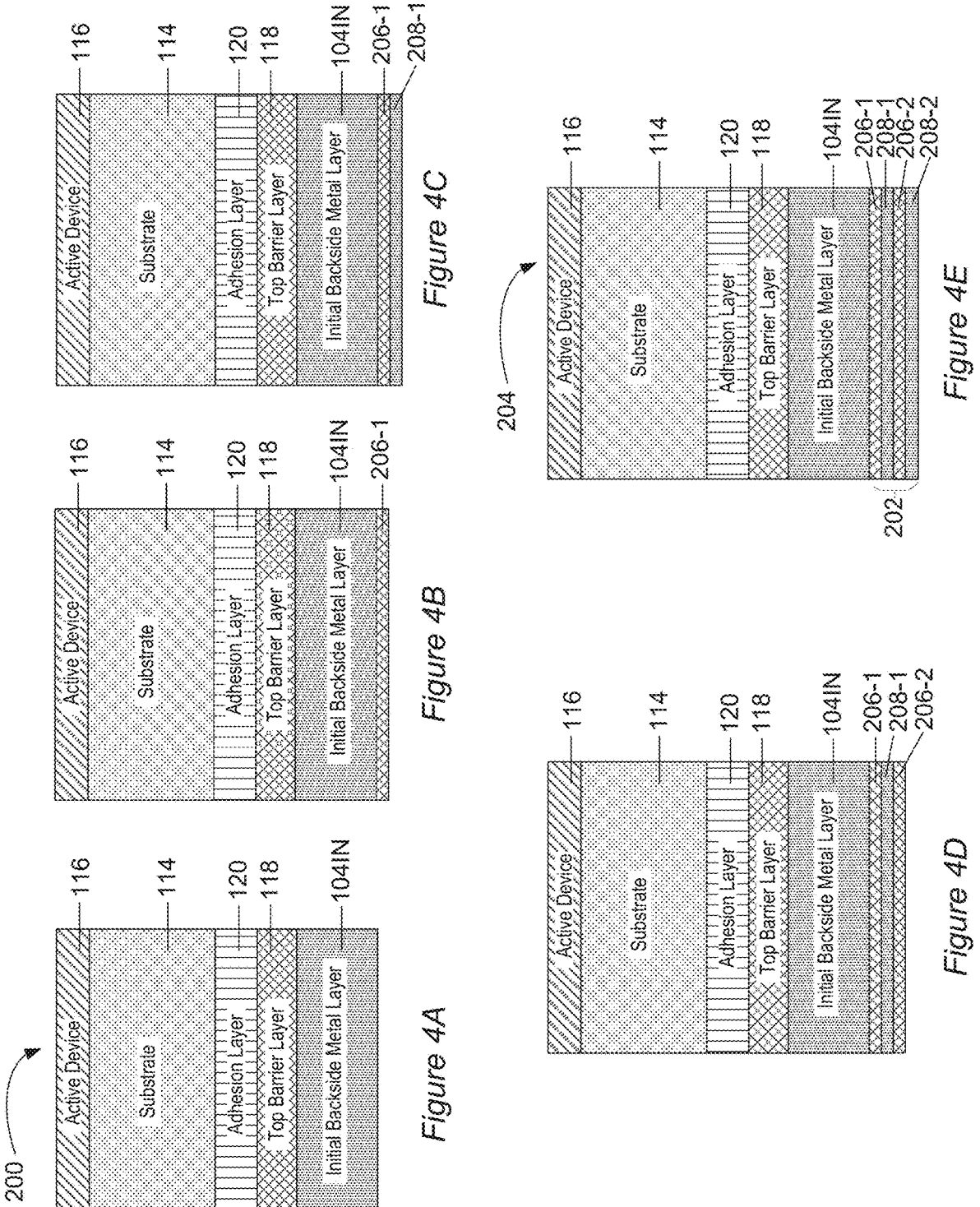
FIGS. 4A-4E show an exemplary procedure for implementing a solderable device die used to form the exemplary microelectronics package shown in FIG. 3.

As illustrated in FIG. 4A, the process begins with an initial device die 200, which includes the substrate 114, the active device 116 over the substrate 114, the top barrier layer 118 adhered underneath the substrate 114 through the adhesion layer 120, and an initial backside metal layer 104IN underneath the top barrier layer 118. The initial backside metal layer 104IN may be formed of Au or Cu with a thickness of at least 0.5 μm (e.g., between 0.5 μm and 10 μm, between 0.5 μm and 3 μm, between 3 μm and 10 μm, or even thicker). For different device applications (i.e., depending on the type of the active device 116), the initial backside metal layer 104IN may be formed of Cu or other conducting metal(s), and/or may have other thickness ranges.

Next, a cap structure 202 is formed underneath the initial backside metal layer 104IN to complete a solderable device die 204, as illustrated in FIGS. 4B-4E. The cap structure 202 includes one or more diffusion blocking layers 206 and one or more anti-oxidation layers 208, which are alternated with the diffusion blocking layers 206. The one or more diffusion blocking layers 206 are configured to prevent diffusion of the solder element (e.g., Sn) from attacking the top barrier layer 118, thereby maintaining the integrity of the top barrier layer 118 during a subsequent reflow process and preventing delamination/cracking in the final package product (described in the following paragraphs and not shown herein). The one or more anti-oxidation layers 208 are configured to prevent oxidation of the diffusion blocking layers 206. Each diffusion blocking layer 206 may be formed of Nickel Vanadium (NiV), Nickel (Ni), Nickel Nitride ($Ni_3N_2$), or platinum (Pt), while each anti-oxidation layer 208 may be formed of Au. Each diffusion blocking layer 206 may have a same or different thickness, which depends on layer stress and total composition consummation (e.g., NiV, Ni, $Ni_3N_2$, or Pt consummation) in the following reflow process.

For the purpose of this illustration, the cap structure 202 includes a first diffusion blocking layer 206-1, a first anti-oxidation layer 208-1, a second diffusion blocking layer 206-2, and a second anti-oxidation layer 208-2. The first diffusion blocking layer 206-1 is formed underneath the initial backside metal layer 104IN (as illustrated in FIG. 4B), the first anti-oxidation layer 208-1 is formed underneath the first diffusion blocking layer 206-1 (as illustrated in FIG. 4C), the second diffusion blocking layer 206-2 is formed underneath the first anti-oxidation layer 208-1 (as illustrated in FIG. 4D), and the second anti-oxidation layer 208-2 is formed underneath the second diffusion blocking layer 206-2 to form the cap structure 202 under the initial backside metal layer 104IN (as illustrated in FIG. 4E). Herein, a total thickness of the first diffusion blocking layer 206-1 and the second diffusion blocking layer 206-2 may be larger than 1000 Å (e.g., between 1000 Å and 5 μm, between 3000 Å and 5 μm, or between 3000 Å and 1 μm). Each of the first anti-oxidation layer 208-1 and the second anti-oxidation layer 208-2 may have a thickness between 500 Å and 3000 Å.

In different applications, the cap structure 202 in the solderable device die 204 may include fewer or more diffusion blocking layers/anti-oxidation layers. As illustrated in FIG. 5A, the cap structure 202 may only include the first diffusion blocking layer 206-1 underneath the initial backside metal layer 104IN and the first anti-oxidation layer 208-1 underneath the first diffusion blocking layer 206-1. Herein, the first diffusion blocking layer 206-1 may have a thickness larger than 1000 Å (e.g., between 1000 Å and 5 μm, between 3000 Å and 5 μm, or between 3000 Å and 1 μm), while the first anti-oxidation layer 208-1 may have a thickness between 500 Å and 3000 Å.

Figure 5B:
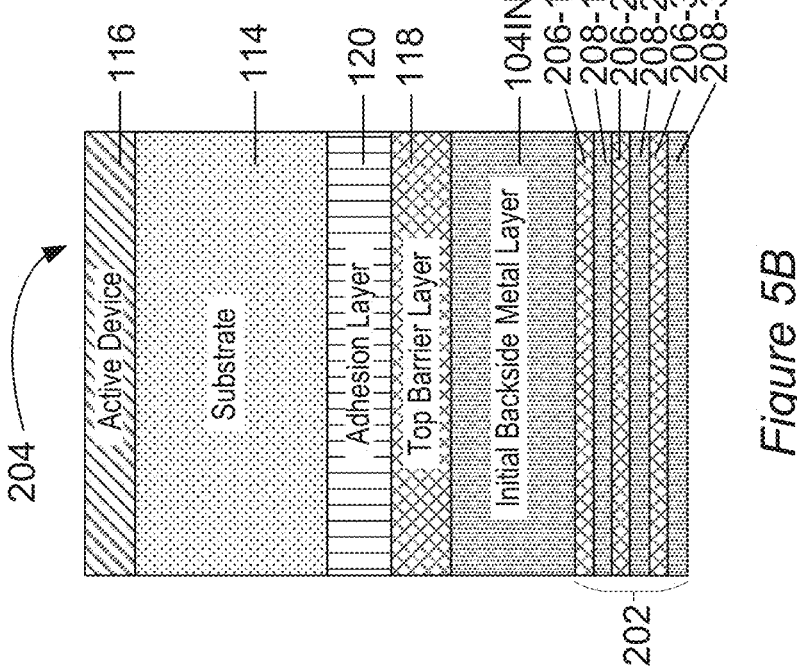
FIGS. 5A-5B show an alternative solderable device die used to form the exemplary microelectronics package.
Figure 5A:
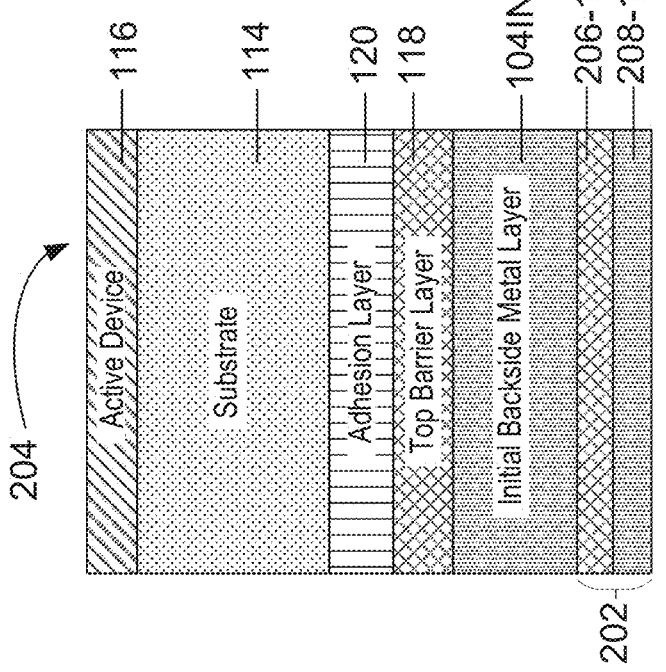

As illustrated in FIG. 5B, the cap structure 202 may include three diffusion blocking layers (e.g., the first diffusion blocking layer 206-1, the second diffusion blocking layer 206-2, and a third diffusion blocking layer 206-3), and three anti-oxidation layers (e.g., the first anti-oxidation layer 208-1, the second anti-oxidation layer 208-2, and a third anti-oxidation layer 208-3). The first diffusion blocking layer 206-1 is underneath the initial backside metal layer 104IN, the first anti-oxidation layer 208-1 is underneath the first diffusion blocking layer 206-1, the second diffusion blocking layer 206-2 is underneath the first anti-oxidation layer 208-1, the second anti-oxidation layer 208-2 is underneath the second diffusion blocking layer 206-2, the third diffusion blocking layer 206-3 is underneath the second anti-oxidation layer 208-2, and the third anti-oxidation layer 208-3 is underneath the third diffusion blocking layer 206-3. Herein, a total thickness of the first diffusion blocking layer 206-1, the second diffusion blocking layer 206-2, and the third diffusion blocking layer 206-3 may be larger than 1000 Å (e.g., between 1000 Å and 5 μm, between 3000 Å and 5 μm, or between 3000 Å and 1 μm). Each of the first anti-oxidation layer 208-1, the second anti-oxidation layer 208-2, and the third anti-oxidation layer 208-3 may have a thickness between 500 Å and 3000 Å.

Regardless of the number of the diffusion blocking layers 206 and the number of the anti-oxidation layers 208 in the cap structure 202, a total thickness of all of the diffusion blocking layers 206 is typically larger than 1000 Å (e.g., between 1000 Å and 5 μm, between 3000 Å and 5 μm, or between 3000 Å and 1 μm). There is always one anti-oxidation layer 208 underneath each diffusion blocking layer 206 (i.e., none of the diffusion blocking layers 206 is exposed at a bottom of the solderable device die 204).

FIGS. 6A-6D graphically illustrate an exemplary reflow process to form the exemplary microelectronics package 100 by soldering the solderable device die 204 shown in FIG. 4E according to some embodiments of the present disclosure. Although the process steps/states are illustrated in a series, the process steps are not necessarily order dependent. Some steps may be done in a different order than that presented, without deviating from the scope of the present disclosure. Further, processes within the scope of this disclosure may include fewer or more process steps/states than those illustrated in FIGS. 6A-6D.

Figures 6A, 6B:
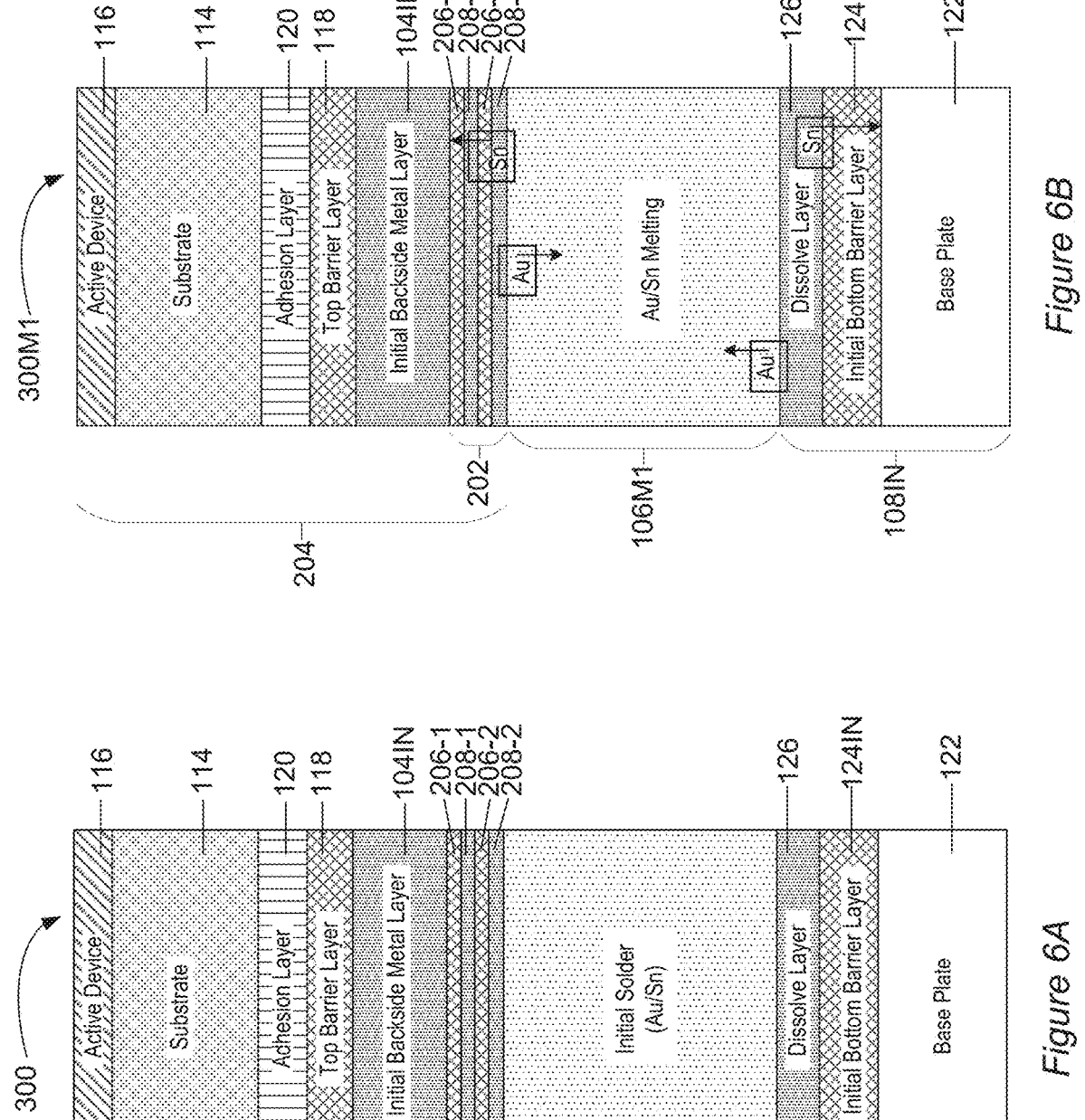
FIGS. 6A-6D show an exemplary procedure for forming the exemplary microelectronics package using the solderable device die shown in FIG. 4E.

FIG. 6A illustrates an initial state, where the solderable device die 204, an initial solder 106IN, and an initial carrier 1081N are stacked vertically to provide an initial package precursor 300. The initial solder 1061N may be an Au/Sn solder with a thickness between 10 μm and 110 μm. For the best joint in the final package, the final solder composition is as close to a eutectic point of 80/20 Au/Sn as possible. To avoid the dynamic Au dissolving and re-precipitation and to compensate for Sn diffusion, the initial solder 1061N may be a Sn rich solder, in which the Au/Sn composition ratio may be smaller than 80/20, such as 78/22 (especially for GaN device applications that require a thick backside Au layer).

The initial carrier 1081N includes the base plate 122, an initial bottom barrier layer 1241N over the base plate 122, and a dissolve layer 126 over the initial bottom barrier layer 1241N. Herein, the initial solder 1061N is placed underneath the cap structure 202 of the solderable device die 204 and over the dissolve layer 126 of the initial carrier 108IN. The diffusion blocking layers 206 (e.g., the first diffusion blocking layer 206-1 and the second diffusion blocking layer 206-2) in the cap structure 202 are configured to trap solder element Sn diffusion during the following reflowing steps, so as to prevent the solder element Sn diffusion into the top barrier layer 118. In different applications, the cap structure 202 in the initial package precursor 300 may only include one diffusion blocking layer 206 and one anti-oxidation layer 208 (see FIG. 5A), or may include multiple diffusion blocking layers 206 and multiple anti-oxidation layers 208 (see FIG. 5B). The dissolve layer 126 helps the initial carrier 1081N better connect to the initial solder 1061N in the following reflowing steps, while the initial bottom barrier layer 1241N helps to block the solder element Sn diffusion and interaction with Cu in the base plate 122 in the following reflowing steps. The rapid formation of Cu—Sn may affect the reliability of the final solder joint.

FIG. 6B illustrates a reflow starting state, where a temperature, which reaches a solder melting point (e.g., 280° C. for Au/Sn solder with the composition ratio of 80/20), is applied to the initial package precursor 300, such that the initial package precursor 300 converts to a reflow starting package precursor 300M1. During this reflow starting state, the initial solder 1061N starts to melt as a melting solder 106M1. Sn elements in the melting solder 106M1 start to diffuse toward the solderable device die 204 (i.e., upward to the cap structure 202 of the solderable device die 204), and start to diffuse toward the initial carrier 1081N (i.e., downward to the initial bottom barrier layer 1241N of the initial carrier 108IN). Au or Cu elements in the initial backside metal layer 1041N and Au elements in the anti-oxidation layers 208 (e.g., the first anti-oxidation layers 208-1 and the second anti-oxidation layers 208-2) start to melt and diffuse downward to the melting solder 106M1, and Au elements in the dissolve layer 126 also start to melt and diffuse upward to the melting solder 106M1.

Figure 6D:
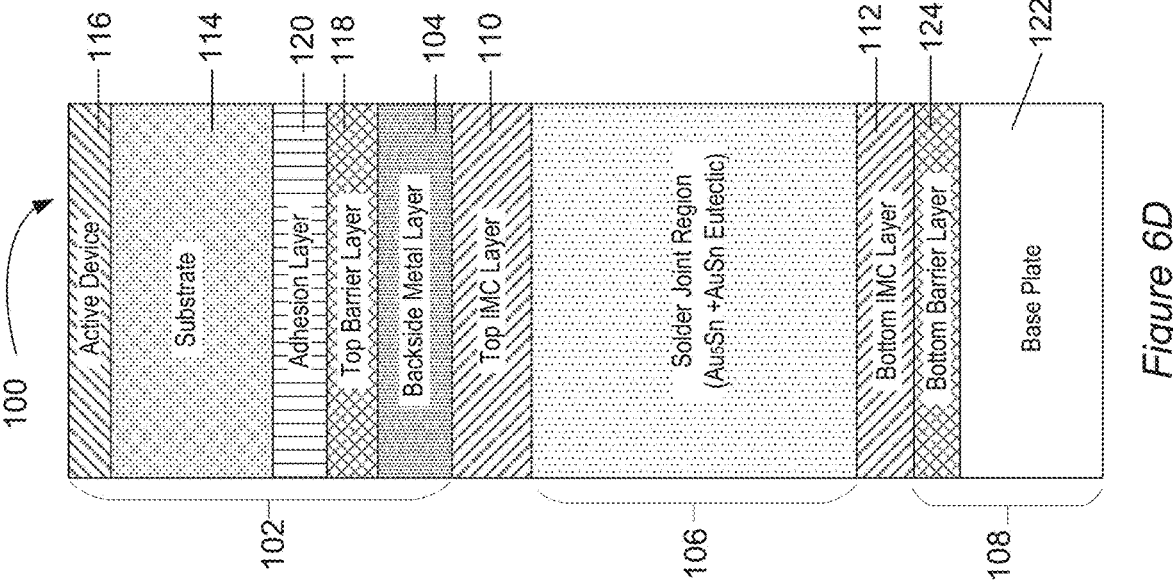
Figure 6C:
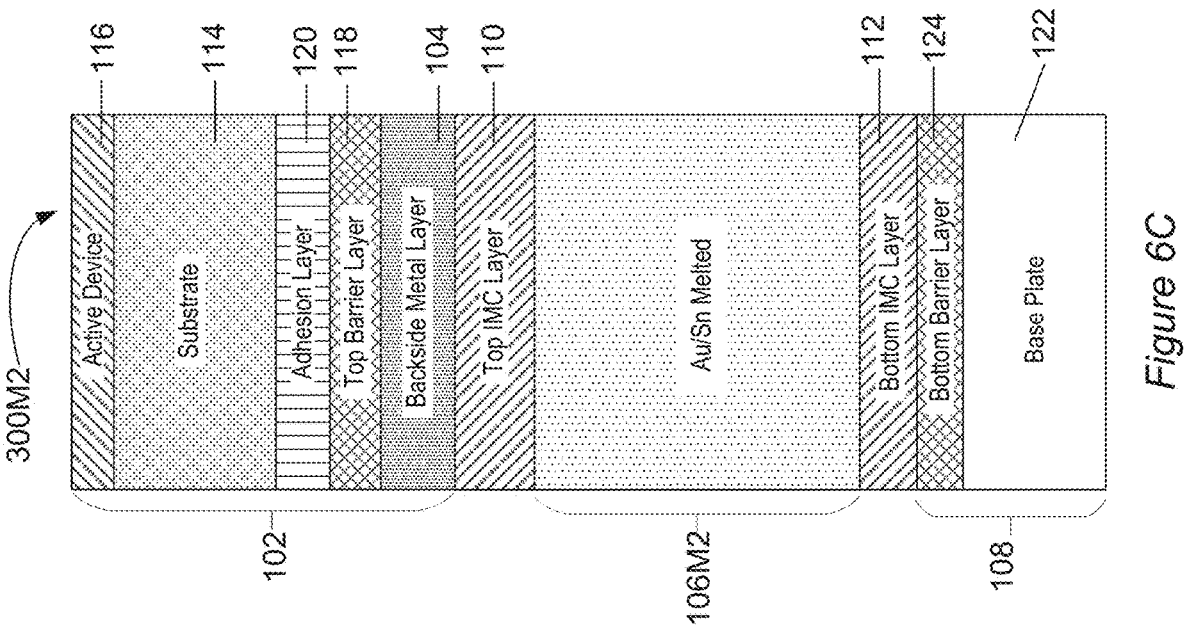

FIG. 6C illustrates a reflowing state, where the applied temperature increases above the solder melting temperature (e.g., increases up to 320° C. for Au/Sn solder), such that the reflow starting package precursor 300M1 converts to a reflowed package precursor 300M2. During the reflowing state, the melting solder 106M fully melts into a molten solder 106M2, and more Sn and Au diffusions occur (if the initial backside metal layer 1041N is formed of Cu, Cu diffusion may also occur). The diffusion blocking layers 206 in the cap structure 202 trap the Sn diffusion from the molten solder 106M2, such that the Sn diffusion from the molten solder 106M2 will not spread out in the final backside metal layer 104 (transition from the initial backside metal layer 1041N) and will not attack the top barrier layer 118. Herein, the Sn diffusion from the molten solder 106M2, the diffusion blocking layers 206 (e.g., NiV, Ni, Ni₃N₂ or Pt), at least portions of the anti-oxidation layers 208 (e.g., Au), and Au diffusion or Cu diffusion from the initial backside metal layer 1041N interact to form the top IMC layer 110. If the diffusion blocking layers 206 are formed of Ni-related material (e.g., NiV, Ni, or Ni₃N₂), the anti-oxidation layers 208 are formed of Au, and the initial backside metal layer 1041N is formed of Au, the top IMC layer 110 will comprise AuNiSn. Herein, Au in the top IMC layer 110 is primarily from the anti-oxidation layers 208 and the molten solder 106M2, and a small portion of Au in the top IMC layer 110 is from the initial backside metal layer 1041N. As such, when the diffusion blocking layers 206 are formed of Ni-related material (e.g., NiV, Ni, or Ni₃N₂), the anti-oxidation layers 208 are formed of Au, and the initial backside metal layer 1041N is formed of Cu (instead of Au), the top IMC layer 110 will comprise both AuNiSn and CuNiSn.

Similarly, when the diffusion blocking layers 206 are formed of Pt, the anti-oxidation layers 208 are formed of Au, and the initial backside metal layer 1041N is formed of Au, the top IMC layer 110 will comprise AuPtSn. When the diffusion blocking layers 206 are formed of Pt, the anti-oxidation layers 208 are formed of Au, and the initial backside metal layer 1041N is formed of Cu, the top IMC layer 110 will comprise both AuPtSn and CuPtSn. The thickness of the top IMC layer 110 is dependent on the thickness of the initial backside metal layer 1041N, a total thickness of the diffusion blocking layers 206, and a total thickness of the anti-oxidation layers 208.

The diffusion from the initial backside metal layer 1041N may be fully dissolved at the cap structure 202 to form the top IMC layer 110, or may be partially dissolved at the cap structure 202 and may further enter the molten solder 106M2. The diffusion from the initial backside metal layer 1041N results in a transition from the initial backside metal layer 1041N to the backside metal layer 104, which may have a thinner thickness than the initial backside metal layer 104IN. The Au diffusion from the anti-oxidation layers 208 may also enter the molten solder 106M2. Herein, the diffusion from the initial backside metal layer 104IN, the Au diffusion from the anti-oxidation layers 208, and the Sn diffusion away from the molten solder 106M2 may lead to a composition ratio (Au/Sn) change (i.e., the Au proportion increases) in the molten solder 106M2.

Similarly, the Sn diffusion from the molten solder 106M2, at least portions of the dissolve layer 126 (e.g., Au), and portions of the initial bottom barrier layer 1241N (e.g., Ni) interact to form the bottom IMC layer 112 (e.g., AuNiSn). In some cases, the dissolve layer 126 may be fully dissolved to form the bottom IMC layer 112, or may be partially dissolved to form the bottom IMC layer 112 and partially diffuse to the molten solder 106M2, which will further increase the Au proportion in the molten solder 106M2. For instance, if the composition ratio of Au/Sn in the initial solder 1061N is lower than 80/20, the final composition ratio of Au/Sn in the molten solder 106M2 may achieve 80/20. The bottom IMC layer 112 formation results in a transition from the initial bottom barrier layer 1241N to the bottom barrier layer 124, which has a thinner thickness than the initial bottom barrier 1241N. The thickness of the bottom IMC layer 112 is dependent on the thickness of the dissolve layer 126 and the thickness of the initial bottom barrier layer 1241N.

FIG. 6D illustrates a cooling state, where the applied temperature decreases below the solder melting temperature (e.g., decreases back to room temperature for Au/Sn solder), such that the reflowed package precursor 300M2 converts to the final microelectronics package 100. During the cooling state, all Au diffusion and Sn diffusion stop, and the interfacial reactions (e.g., the formation of the top IMC layer 110 and the formation of the bottom IMC layer 112) stop. The molten solder 106M2 solidifies to form the solid solder joint region 106 including the Au₅Sn and AuSn eutectic mixture.

To verify reliability of the microelectronics package 100, a temperature cycling (TC) test (e.g., temperature from −55° C. to 125° C.) may be applied to the microelectronics package 100 (not illustrated). It is demonstrated that the microelectronics package 100 formed from the solderable device die 204 with the backside metal stack (i.e., a combination of the initial backside metal layer 1041N and the cap structure 202) will not suffer delamination or cracking during the TC test.

Figure 7:
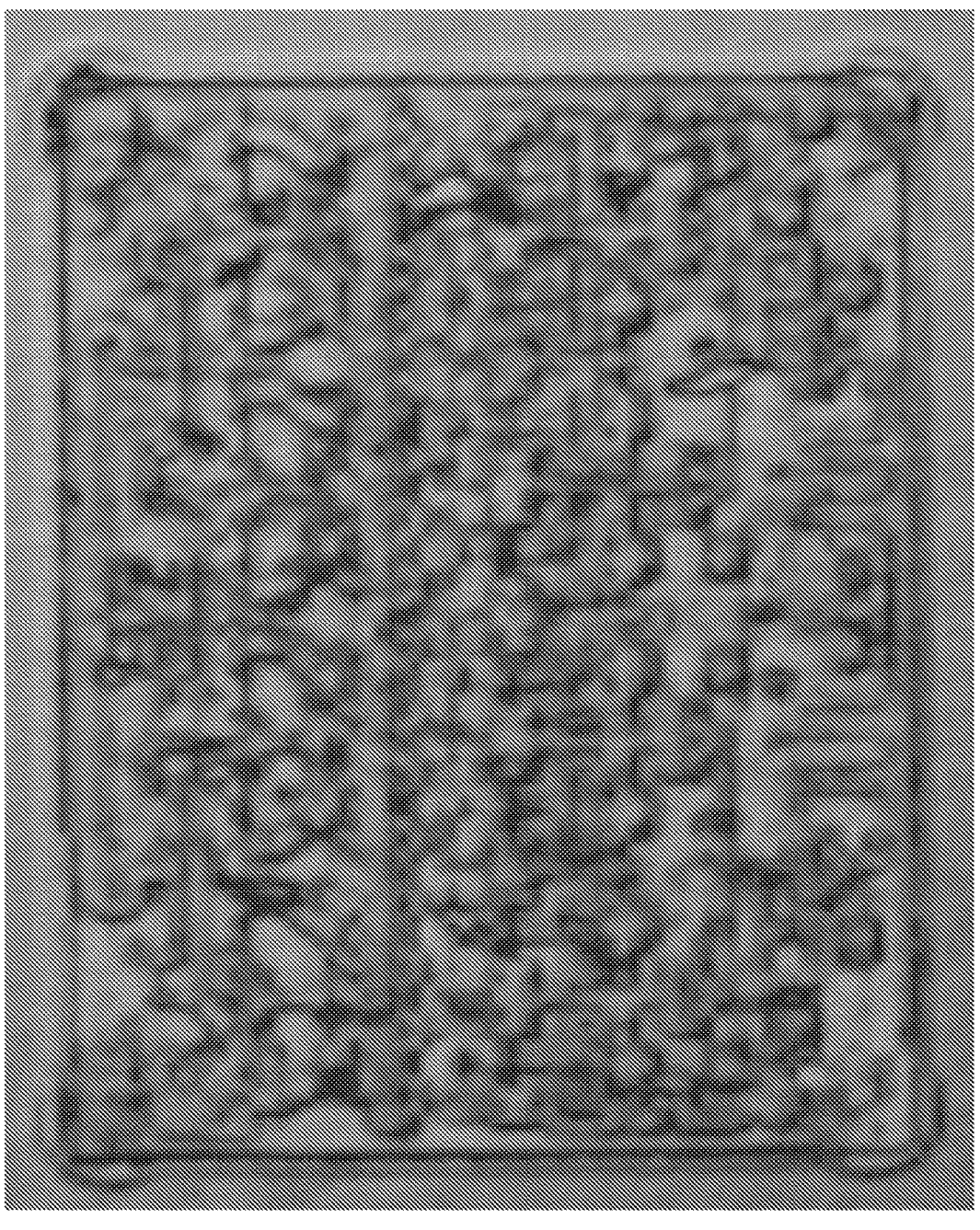
FIG. 7 shows a CSAM result of a GaN package formed by the procedure illustrated in FIGS. 6A-6D.
Figure 8:
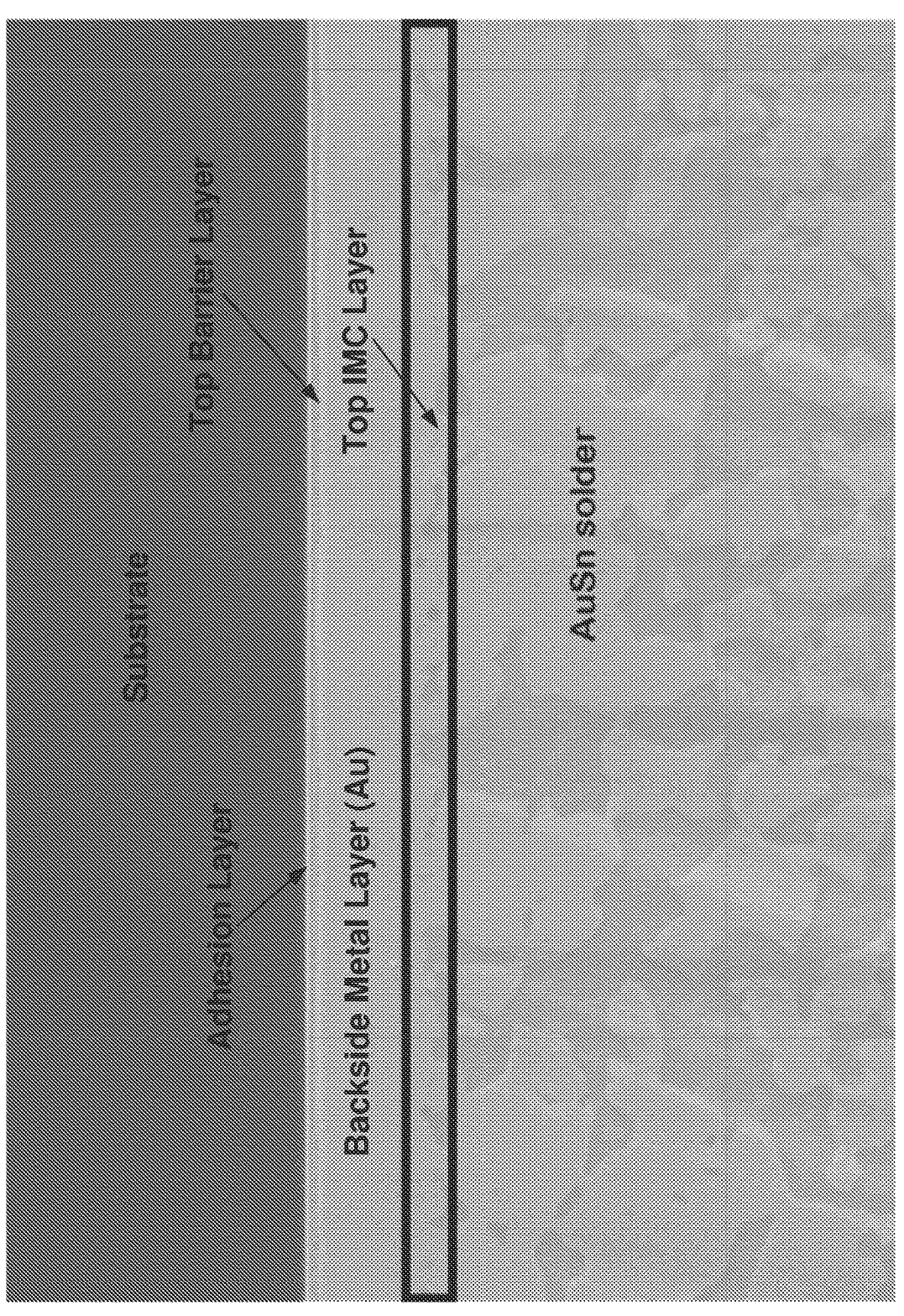
FIG. 8 shows a FIB cross-section image of the GaN package at a solder joint.

FIG. 7 shows a CSAM result of a GaN package (e.g., the active device in the package is a GaN device, while the substrate is formed of SiC) formed by the process illustrated in FIGS. 6A-6D after the TC test. FIG. 8 further shows a FIB cross-section image of the GaN package at a solder joint. It is clear that such GaN package does not have delamination or cracking.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A microelectronics package comprising:
a carrier;
a solder joint region formed over the carrier;
a top intermetallic (IMC) layer formed over the solder joint region; and
a device die formed over the top IMC layer, wherein:
the device die includes a substrate, an active device formed over the substrate, a top barrier layer formed underneath the substrate, and a backside metal layer formed vertically between the top IMC layer and the top barrier layer;
the backside metal layer is formed of copper (Cu) and has a thickness of at least 0.5 μm;
the solder joint region comprises an Au-rich gold-tin (AuSn) and gold-tin (AuSn) eutectic mixture; and
the top IMC layer comprises copper nickel tin (CuNiSn) and gold nickel tin (AuNiSn), or comprises copper platinum tin (CuPtSn) and gold platinum tin AuPtSn.

2. The microelectronics package of claim 1 wherein the backside metal layer has a thickness between 0.5 μm and 10 μm.

3. The microelectronics package of claim 1 wherein the top barrier layer is formed underneath the substrate via an adhesion layer.

4. The microelectronics package of claim 1 wherein the top barrier layer is formed directly underneath the substrate.

5. The microelectronics package of claim 1 wherein:
the active device is one of a group consisting of a Gallium Nitride (GaN) device, a silicon (Si) device, and a Gallium Arsenide (GaAs) device; and
the substrate is formed of one of a group consisting of silicon carbon (SiC), Si, GaN, Sapphire, and GaAs.

6. The microelectronics package of claim 1 further comprising a bottom IMC layer vertically between the carrier and the solder joint region, wherein:
the carrier includes a base plate and a bottom barrier over the base plate; and
the bottom IMC layer is formed over the bottom barrier of the carrier.

7. The microelectronics package of claim 6 wherein:
the bottom IMC layer comprises AuNiSn;
the bottom barrier is formed of nickel (Ni); and
the base plate comprises Cu.

8. A microelectronics package comprising:
a carrier;
a solder joint region formed over the carrier;
a top intermetallic (IMC) layer formed over the solder joint region; and
a device die formed over the top IMC layer, wherein:
the device die includes a substrate, an active device formed over the substrate, a top barrier layer formed underneath the substrate, and a backside metal layer formed vertically between the top IMC layer and the top barrier layer;
the backside metal layer is formed of gold (Au);
the top IMC layer comprises gold platinum tin (AuPtSn); and
the solder joint region comprises an Au-rich gold-tin (AuSn) and gold-tin (AuSn) eutectic mixture.

9. The microelectronics package of claim 8 wherein the backside metal layer has a thickness between 0.5 μm and 10 μm.

10. The microelectronics package of claim 8 wherein the top barrier layer is formed underneath the substrate via an adhesion layer.

11. The microelectronics package of claim 8 wherein the top barrier layer is formed directly underneath the substrate.

12. The microelectronics package of claim 8 wherein:
the active device is one of a group consisting of a Gallium Nitride (GaN) device, a silicon (Si) device, and a Gallium Arsenide (GaAs) device; and
the substrate is formed of one of a group consisting of silicon carbon (SiC), Si, GaN, Sapphire, and GaAs.

13. The microelectronics package of claim 8 further comprising a bottom IMC layer vertically between the carrier and the solder joint region, wherein:
the carrier includes a base plate and a bottom barrier over the base plate; and
the bottom IMC layer is formed over the bottom barrier of the carrier.

14. The microelectronics package of claim 13 wherein:
the bottom IMC layer comprises AuNiSn;
the bottom barrier is formed of nickel (Ni); and
the base plate comprises Cu.

\* \* \* \* \*